United States Patent [19]
Larson

[11] Patent Number: 6,018,807
[45] Date of Patent: Jan. 25, 2000

[54] SIMULATION "BUS CONTENTION" DETECTION

[75] Inventor: Douglas A. Larson, Lakeville, Minn.

[73] Assignee: Micron Electronics, Inc., Nampa, Id.

[21] Appl. No.: 08/937,860

[22] Filed: Sep. 25, 1997

[51] Int. Cl.[7] .................................................. G06F 11/00
[52] U.S. Cl. .................. 714/33; 714/28; 714/43
[58] Field of Search .................... 395/183.19, 183.16; 714/43, 40, 33, 32, 28

[56] References Cited

U.S. PATENT DOCUMENTS

| | | | |
|---|---|---|---|
| 4,236,246 | 11/1980 | Skilling | 371/27 |
| 4,744,084 | 5/1988 | Beck et al. | 371/23 |
| 4,937,827 | 6/1990 | Beck et al. | 371/23 |
| 5,287,464 | 2/1994 | Kumar et al. | 395/325 |
| 5,430,747 | 7/1995 | Jibbe et al. | 371/57.1 |
| 5,872,953 | 2/1999 | Bailey | 395/500 |

*Primary Examiner*—Norman Michael Wright
*Attorney, Agent, or Firm*—Dorsey & Whitney LLP

[57] ABSTRACT

A method and apparatus for determining if contention exists in a simulated electronic circuit due to multiple simulated drivers contending for the same simulated bus. A contention detection function counts the number of simulated drivers on the simulated bus which are active. If the number of active simulated drivers is greater than one, then an error message is generated reporting contention. The invention is suitable for computer implementation and is particularly well suited for simulation of an integrated circuit. A conversion function can be applied to translate the output of the simulated drivers into a format suitable for processing by the contention detection function and can also retranslate the output of the resolution function into a format suitable for further processing in the simulated electronic circuit. The active state of a simulated driver can be indicated by either a predetermined high voltage level or a predetermined low voltage level. The method and apparatus are capable of detecting where contention arises when two or more active simulated drivers each output the same voltage level, as well as when two or more active simulated drivers output different voltage levels. The method and apparatus can also detect the presence or absence of a "turn around" clock cycle.

28 Claims, 5 Drawing Sheets

SIMULATION "BUS CONTENTION" DETECTION

TECHNICAL FIELD

The present invention relates to the simulation of an electronic circuit, and more particularly to the detection of bus contentions during simulation of the electronic circuit.

BACKGROUND OF THE INVENTION

In recent years, semiconductor process technology has rapidly progressed to permit increasingly complex systems both at the integrated-circuit level and at the circuit-board level. As a result, system designers have increased their demand for computer aided design ("CAD") tools to automate the design process and thereby reduce the time necessary to implement their system designs.

What was once a "bottom-up" design process, beginning from the circuit and gate level and working toward the system level, has become an increasingly "top-down" process, whereby the system designer designs a system at the abstract level and works down toward its implementation on the circuit and gate level.

A number of factors have been responsible for the move to a "top-down" approach. First, the availability of standard cell libraries, gate-arrays and ASIC ("Application Specific Integrated Circuit") technology has provided the system designer with a host of semiconductor building blocks with which to implement system designs. In addition, CAD tools are able to create hardware descriptions of systems designs using standard languages such as Verilog and VHDL ("Very High-Scale Integrated Circuit Hardware Description Language"). A system represented in VHDL can then be fed into a synthesis tool, which converts the VHDL representation into an actual circuit block implementation for a given semiconductor technology.

Before a system design is implemented, its behavior is typically verified in simulation. CAD tools simulate the system once it has been converted to a VHDL representation to verify logical behavior and/or timing behavior of the system. Some simulators are event-driven simulators while others are discrete time simulators.

Contention is a problem arising in an electronic circuit when more than one driver contends for utilization of a single bus. Contention is a serious design problem which should be detected in simulation to ensure that the resulting circuit operates as expected.

FIG. 1 depicts a typical simulated electronic circuit in which contention may arise. In FIG. 1, simulated drivers 100, 101 and 102 have their respective outputs 103, 104, and 105 interconnected to simulated bus 106. Each of these drivers can be either active or inactive. When inactive, the driver is in a high-impedance state and can be effectively considered to be disconnected from the bus. When active, the driver is driving the bus with a value of the active state. For example, in VHDL, the industry standard logic type has nine state values: 1, 0, H, L, -, Z, X, U, and W. Typically, 1, 0, -, X, U, and W are "active" state values while H, L, and Z are "inactive" state values. A contention condition will arise if more than one of these drivers provides an active output signal to the simulated bus during the same time interval. In conventional simulation systems, the bus is represented by an industry standard data type, such as the IEEE Std_Logic. Associated with this data type is a resolution function. The input parameters to the resolution function are the output value of each driver connected to the bus. The resolution function then determines (or resolves) the value on the bus based upon these input parameters. The simulator invokes this resolution function during the simulation to determine the value on the bus. FIGS. 2A, 2B, and 2C illustrate a sample display of the values on a bus at different times by the simulator. FIGS. 2A and 2C illustrate a waveform representing a high (e.g., "1") and low (e.g., "0") value on the bus. When only one driver is active and outputting a high value the resolution function resolves to a bus value of high. When only one driver is active and outputting a low value the resolution function resolves to a bus value of low. If, however, multiple drivers are active and at least one driver is outputting a high value and at least one driver is outputting a low value, then the resolution function resolves to an indeterminate bus value as shown in FIG. 2B.

The conventional technique of detecting such contention during simulation requires visual inspection by a skilled technician of the waveforms representing the value on the simulated bus at various time intervals. That is, the technician would view the waveforms of FIGS. 2A and 2C and would note that the waveforms are normal, but when viewing the waveform of FIG. 2B, the technician would note that the waveform is abnormal. The technician may realize that the abnormality is a result of bus contention. Conventional techniques may display such abnormal waveforms in color to bring the abnormality to the attention of the technician.

Such bus contentions that result in the abnormal waveform occur when multiple drivers drive different active states. In other words, one driver provides an output such as that shown in FIG. 2A while another driver provides an output such as that shown in FIG. 2C. These contending outputs result in the signal on the bus going to the abnormal state which could be represented as shown in FIG. 2B or virtually any waveform other than the waveforms shown in FIG. 2A and FIG. 2C.

A problem arises in the conventional techniques because the output of the resolution function resolves to a normal value when more than one driver is active and the active drivers are outputting the same value. In other words, more than one driver is active on the bus but each of the drivers are outputting the same signal value, such as that shown in FIG. 2A or FIG. 2C. For example, drivers implemented with Gunning Transistor Logic "GTL" can only output one type of value when active. Thus, any time multiple GTL drivers are active the resolution function resolves to a normal value. Such an event does produce contention on the bus, but a contention condition arising in this manner will escape detection by the technician. The contention will be missed because the actual value of the signal on the bus resolves to a normal value. Thus, a visual inspection of the waveform would indicate that the value on the bus is normal.

An additional problem may also arise using the conventional techniques when contention only exists for a short duration (i.e., less than a clock cycle). The visual inspection technique may fail because the technician viewing the waveforms may have the display resolution of the simulation set at too coarse of a level to show the contention. The technique of detecting for the indeterminate state could fail because this technique normally only checks for indeterminate states at clock edges, since the contention is less than a clock cycle, it is not guaranteed to span a clock edge. The reason previous techniques only check for indeterminate states at clock edges is that normally simulation models drive indeterminate states as part of their normal operating procedures. For example, an "X" may be driven until the very end of the clock cycle before changing to a value such as "1". Simulations are typically driven in simulation time units which occur more frequently than a clock cycle. For example, a simulation time unit could represent a picosecond while a clock cycle occupies a nanosecond. In this example, the granularity of the simulation would be a picosecond. When driving a bus signal, a simulation model may bracket the data valid window (defined by bus specification) of that signal, such that, if the design under test does not meet timing, an indeterminate value is gated into the design, thereby, indicating an error condition.

One conventional technique for detecting contentions requires the use of external ports through which connections are added to the circuit design for examining the enable lines to the various drivers to detect when each of the drivers is in an active state. However, this conventional technique requires the simulated circuit to have additional connection points, connection points which would not be present in the circuit as implemented. In other words, such a simulation would test a circuit which is different from the circuit for which implementation is proposed.

Finally, another anomaly arises with conventional techniques caused because the initial state of the logic in most simulations is indeterminate. Thus, the conventional techniques suffer from an inability to distinguish between an initial state and an abnormal value caused by contention.

SUMMARY OF THE INVENTION

Some embodiments of the present invention provide a method for determining if a contention condition exists on a simulated bus when simulating an electronic circuit by counting the number of active simulated drivers on the simulated bus. If the number of active simulated drivers is greater than one, then a contention indication is generated to notify the designer that a contention has occurred on the simulated bus.

Embodiments of this invention further provide automatic bus contention detection during simulation. Embodiments of this invention also allow detection of both same state bus contention detection and differing state bus contention detection. In other words, contention is detected when multiple active drivers output different signal values and when multiple active drivers output the same signal value. Embodiments of this invention also provide detection of bus contentions regardless of contention duration.

Embodiments of this invention further provide two new data types (one for scalar signals and one for vectored signals, which are also known as "hyperbits"), associated resolution functions for each new data type, and data conversion functions to industry standard data types. To automatically check for bus contention, a circuit designer implements each bussed signal in its respective new data type then connects the bussed signals to each component, using the appropriate conversion function to resolve type conflicts. The respective resolution functions will then determine if bus contention occurs as the resolution functions are called to resolve the signal's final value.

Embodiments of the present invention also provide the ability to test a proposed electronic circuit for contention on a simulated bus without requiring any modification of the proposed design.

DETAILED DESCRIPTION OF THE INVENTION

The present invention provides a method and system for the automatic detection of contentions on a simulated bus. One embodiment of the present invention provides a contention detection mechanism that determines whether more than one driver that is connected to the bus is active, and if so indicates that there is contention for the bus. The contention detection mechanism is implemented as a contention resolution function that, in addition to resolving the value of the bus signal as is done by the typical resolution functions, determines whether more than one driver is active. The input parameters to the resolution function are the output values of each driver connected to the bus. The outputs of the contention resolution function are the value to which the inputs resolve and an indication as to whether there is contention for the bus.

In one embodiment, the contention detection mechanism works in conjunction with a conventional simulator by defining a new data type for a bus. When the new data type is defined to the simulator, the new data type is associated with the contention resolution function. Thus, during simulation, the simulator will invoke the contention resolution function to resolve the value of the bussed signal. The invoked contention resolution function will also detect and report any contention on the bus. To allow the system designer to utilize this new data type, the contention detection mechanism includes two data type conversion components. A standard-to-new data type conversion component converts the output of the drivers, which have a standard logic data type, to the new data type, and a new-to-standard data type conversion component which converts the resolved value in the new data type to the standard logic data type so that the value is compatible with existing simulated devices.

Figure 1:
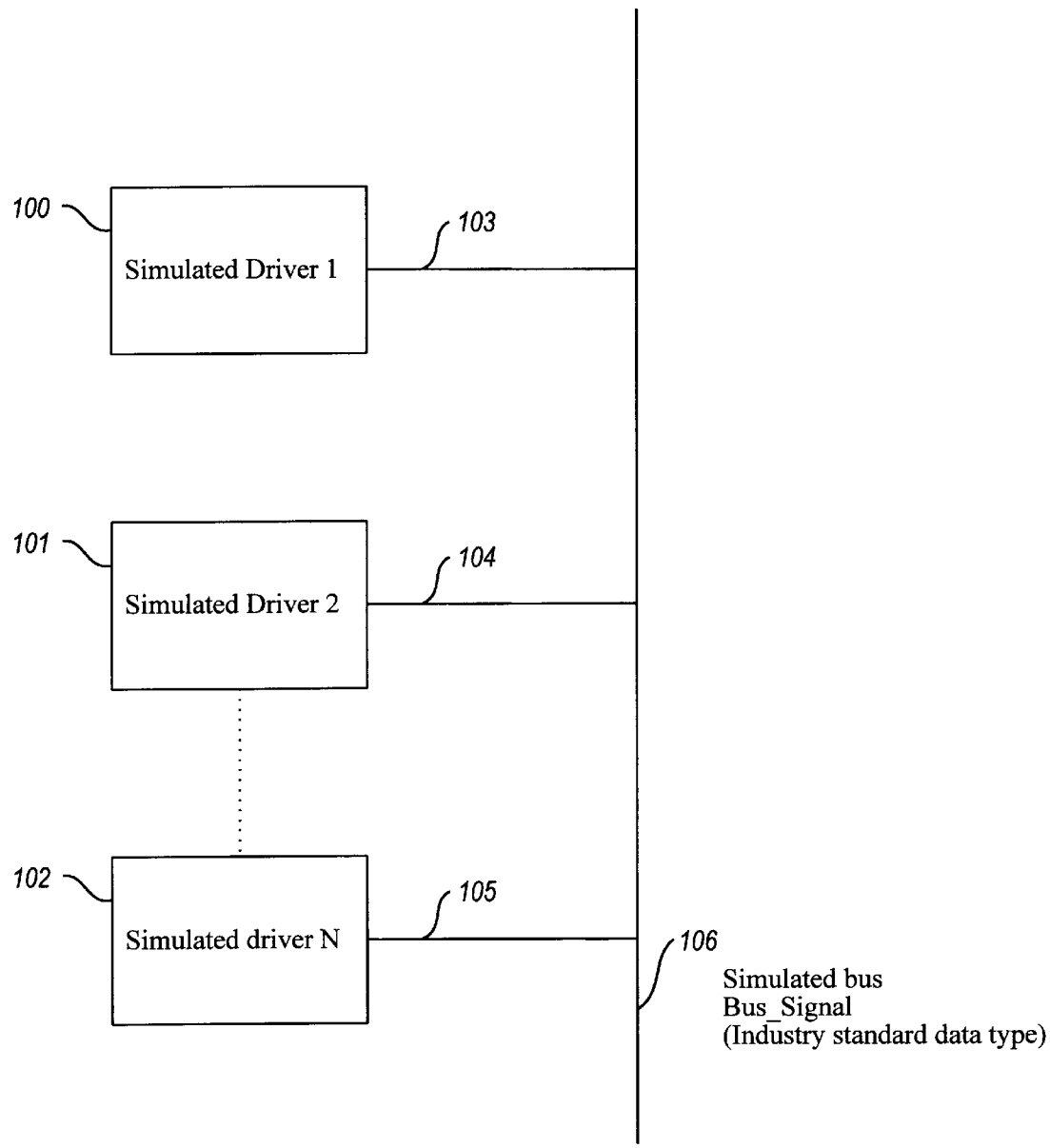
FIG. 1 depicts a block diagram of a conventional simulated bus connected to the output of conventional simulated drivers.
Figure 2A:
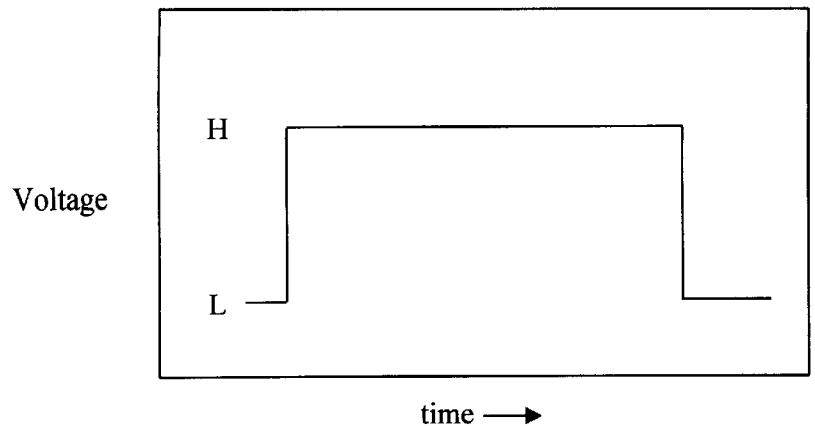
FIGS. 2A, 2B, 2C each depict various waveform patterns typically provided by conventional bus simulations.
Figure 2B:
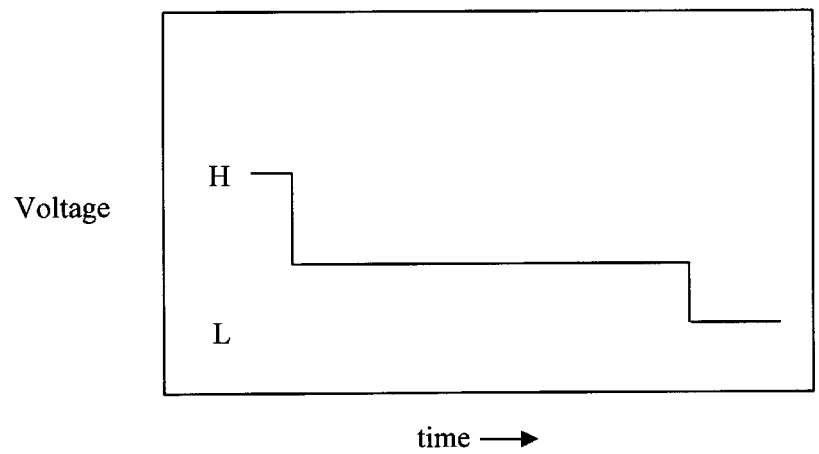
Figure 2C:
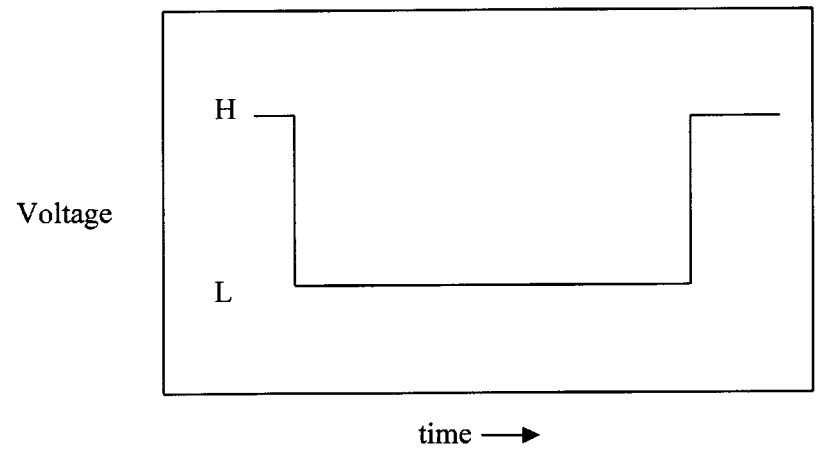
Figure 3:
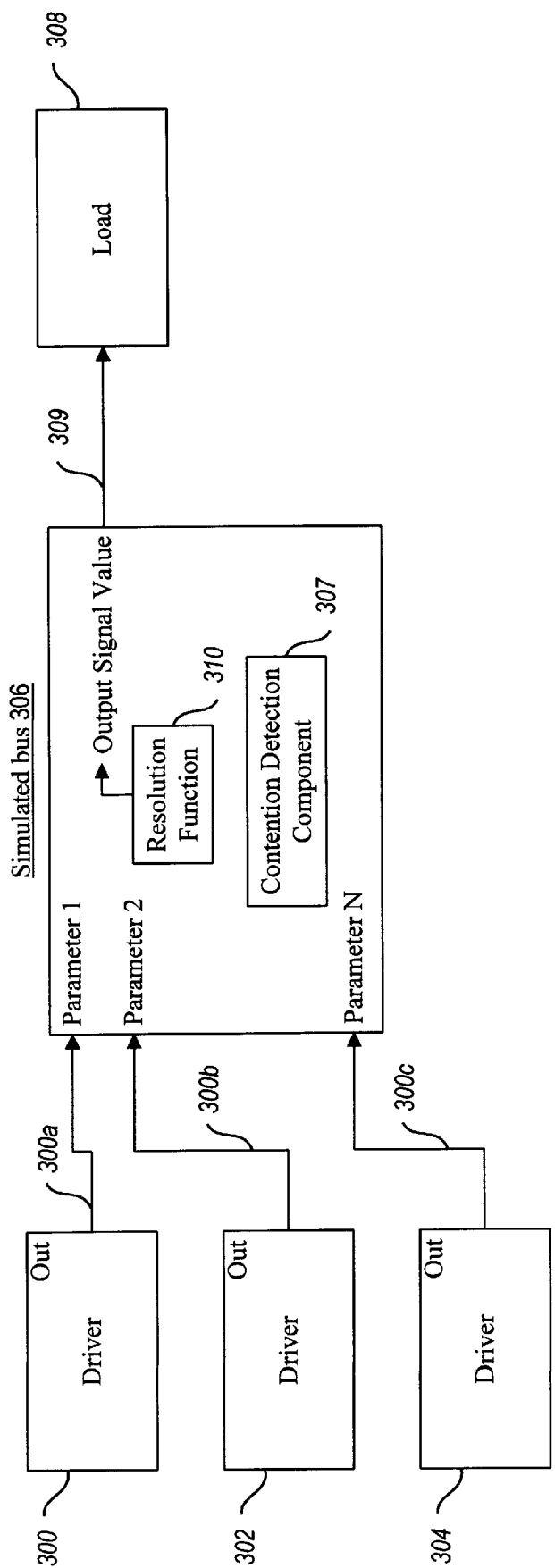
FIG. 3 depicts a block diagram of a simulated bus and simulated drivers of the present invention.

FIG. 3 depicts three simulated drivers (300, 302, 304) whose outputs (300a, 300b, 300c) are each connected to a simulated bus 306. The simulated bus receives each of the respective outputs (parameter 1, parameter 2, parameter N) from the simulated drivers. The simulated bus is associated with a contention resolution function that comprises the Resolution Function 310 and the Contention Detection Component 307. A Resolution Function determines the resolved value 309 of the simulated bus. The resolved value of the simulated bus is received by a simulated load 308. Of course, the output of the simulated bus could also be received by additional loads. The Contention Detection component determines whether contention is occurring on the simulated bus, that is, whether multiple drivers are currently active. Thus, the simulated bus comprises the input parameters, the Contention Detection Component, the Conflict Resolution Function, and the resolved value.

Figure 4:
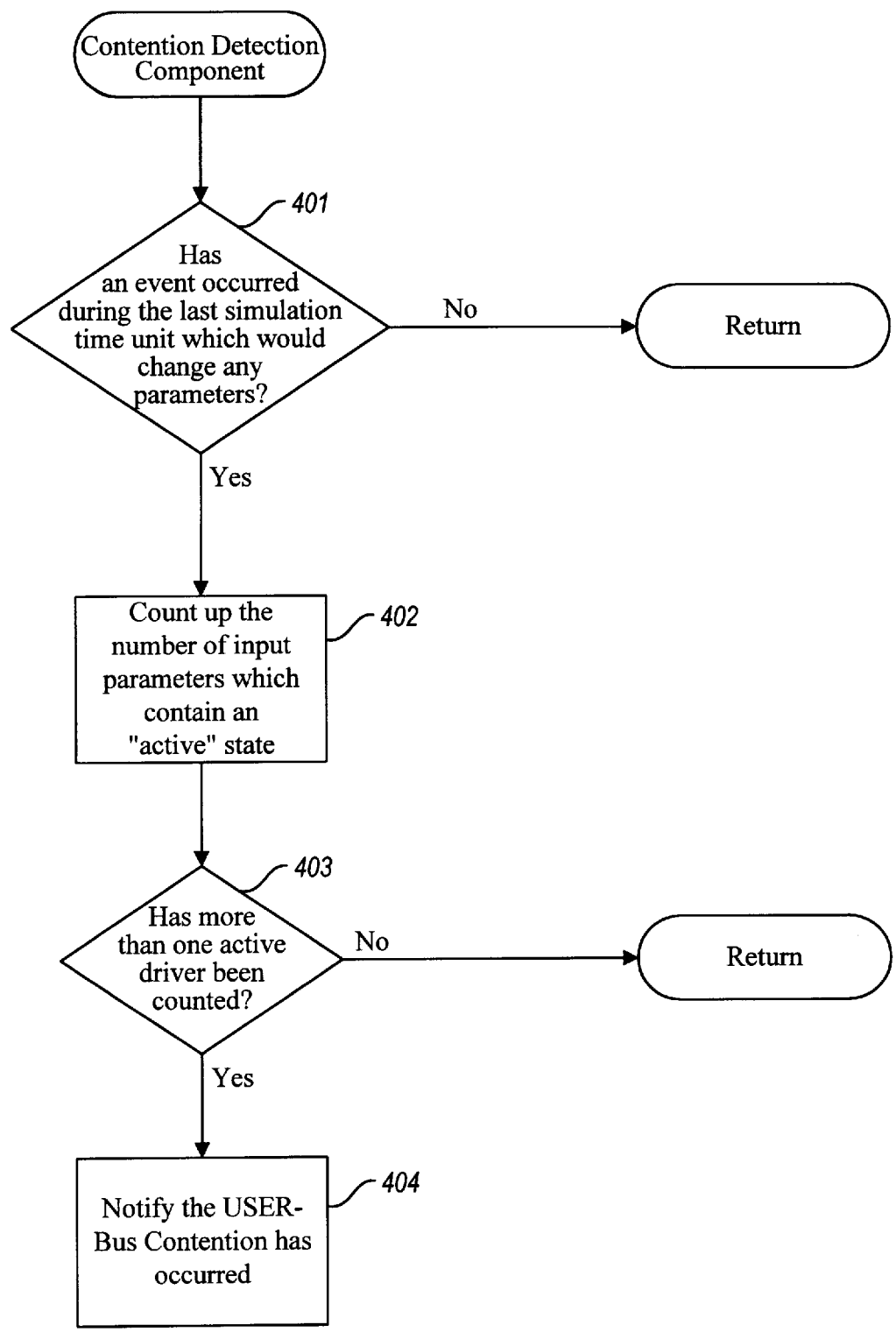
FIG. 4 provides a flow chart indicative of an embodiment of the conflict resolution function of the present invention.

When a bus, such as the simulated bus of FIG. 3, is declared in the simulation, not only is memory set aside to hold the state or value of the output signal, the bus is also associated with a specific resolution function based on the data type of the signals connected to the bus. The Resolution Function determines the resolved value based upon the value of each driver input to the bus and a set of rules governing how these states resolve. FIG. 4 is a flow chart of the operation of the Contention Detection Component. In step 401, if an event has occurred which would change any input values (i.e., parameters) to this component since it was last invoked, then the component continues at step 402, else the component returns. In step 402, the Contention Detection Component counts the number of drivers which are generating active outputs. In step 403, if more than one driver is active, then a contention is detected, and the component continues to step 404, else component returns. In step 404, the Contention Detection Component prepares and displays an error message indicating that a bus contention has occurred. The error message could take many forms, such as a message generated to a computer screen on which the output of the simulated circuit is being shown, or in the form of a printed message, or by the flipping of a bit somewhere in a computing system which would be indicative of an error. The error message could also terminate the simulation or take other proactive steps to bring the contention error to the detection of the designer.

Embodiments of the present invention are also applicable to simulations in which the various drivers each output one bit as well as when the drivers output multiple bits in the form of a vectored signal or "hyperbits".

The following provides an example of contention detection by the contention detection mechanism of the present invention. Assume that drivers 300, 302, and 304 of FIG. 3 output a "Z," "1," "1," respectively. "Z" represents the high impedance state. These outputs indicate a bus contention because two drivers are outputting a "1", and "1" is an active state. The rules governing the resolution of the industry standard data type STD_LOGIC state that this condition resolves to a "1." Therefore, the Resolution Function 310, given the "Z," "1," "1," as inputs, would output the value of "1" as the resolved output. However, from this output one cannot detect the contention. As one can see, from the perspective of the output signal, no contention has occurred. However, the Conflict Detection Component can access the output value of each of the simulated drivers individually and use this information to detect bus contention. To detect bus contention, the Contention Detection Component determines whether more than one of the input values indicates an active state, and if so, contention is detected.

The new data type described herein functions similarly to the industry standard data type with the exception that this new data type defines a resolution function which checks for bus contention. This newly defined data type may be used when interconnecting devices with industry standard port types. To allow these devices to connect to a bus requires a set of data type conversion functions for converting from the newly defined data type to the industry standard data type, and vice versa. Since the newly defined data type "behaves" like the industry standard data types, the conversion components are one-to-one in nature. That is, each state of the newly defined data type is converted to the same state in the industry standard data type. The reverse is also true, each state of the industry standard data type is converted to the same state in the newly defined data type.

Figure 5:
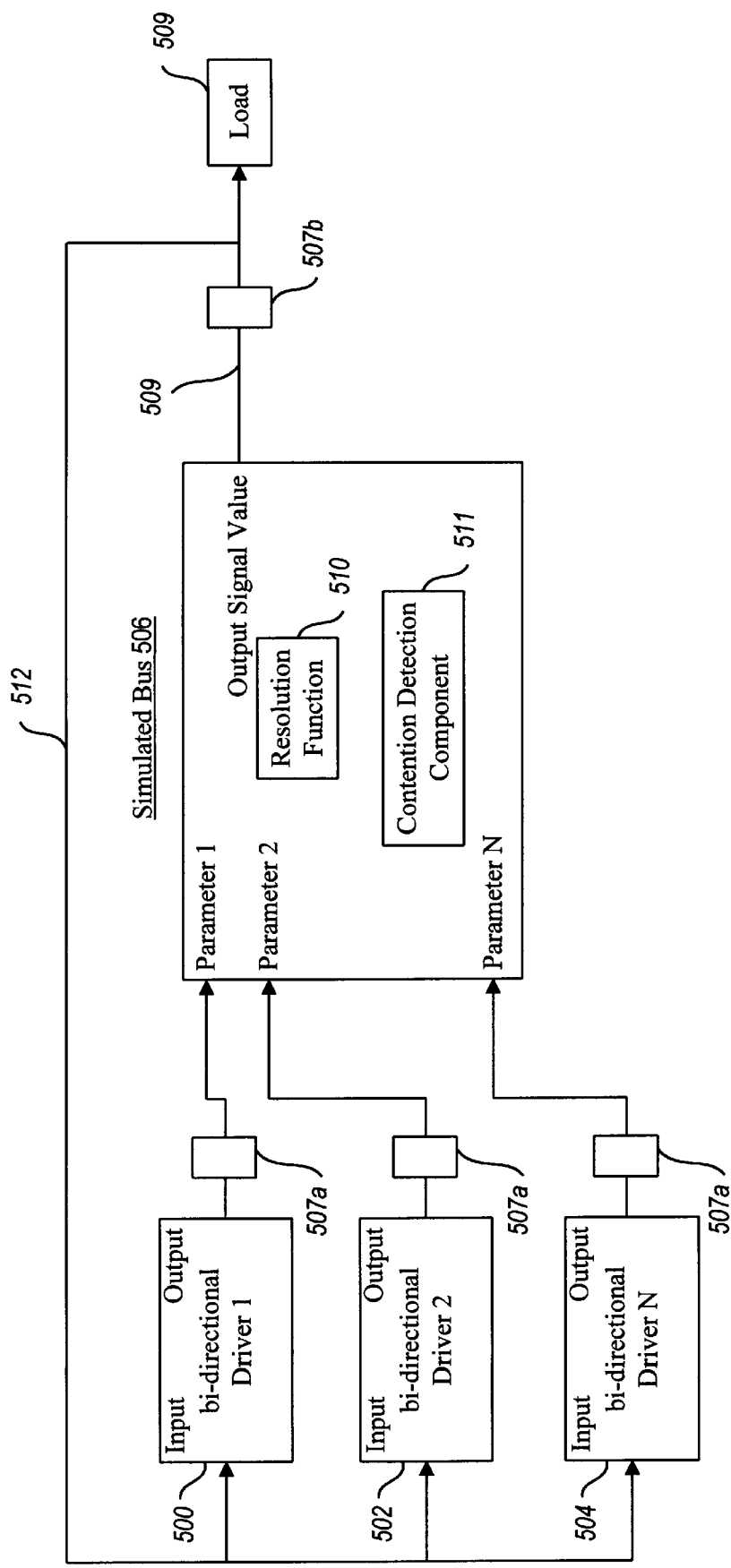
FIG. 5 depicts a block diagram of a simulated bus, simulated drivers, and simulated conversion functions of the present invention.

FIG. 5 depicts use of the data type conversion functions by the contention detection mechanism. The inputs and outputs of the simulated bi-directional drivers 500, 502, 504, as well as the input to load 509 are all represented by an industry standard data type. The standard-to-new data type conversion component 507*a* and the new-to-standard data type conversion component 507*b* supply the interconnect between these inputs and outputs (industry standard data types) and the simulated bus 506 (newly defined data type). The process works as follows: the outputs of bi-directional drivers 500, 502 and 504 are input to the standard-to-new data type conversion component 507*a*, which converts the value to the corresponding new data type value and presents this value to the simulated bus 506. The simulated bus 506 passes these values to the resolution function 510, which outputs the resultant signal value 509. This resultant value 509 is presented the new-to-standard data type conversion component 507*b*, which converts the value back to the industry standard data type. This converted value 512 is then supplied to the inputs of bi-directional drivers 500, 502, 504, as well as, load 509. Using these data type conversion functions, the conflict resolution mechanism described herein can be easily integrated into a variety of electronic circuit simulation systems without requiring extensive modification.

Listed below is a VHDL representation of "n" bussed devices. It is shown with and without bus contention detection:

```
Assumptions:   new_data_type :  is a new data type with embedded bus contention
                                detection
               To_Std_Logic :   is a data conversion function that resolves type
                                conflicts between the new_data_type and the
                                std_logic data type
Standard Bus interconnection WITHOUT bus contention detection:

SIGNAL Bused_Signal : std_logic;            -- Wire: industry standard data type
Device0 : box portmap (IO=>Bused_signal);   -- Instantiate Device 0
Device1 : box portmap (IO=>Bused_signal);   -- Instantiate Device 1
Device1 : box portmap (IO=>Bused_signal);   -- Instantiate Device 1
Devicen : box portmap (IO=>Bused_signal);   -- Instantiate Device n
Standard Bus interconnection WITH bus contention detection:

SIGNAL Bused_Signal : new_data_type;                    -- Wire: new_data_type
Device0 : box portmap (IO=>To_Std_Logic(Bused_signal)); -- Instantiate Device 0
Device1 : box portmap (IO=>To_Std_Logic(Bused_signal)); -- Instantiate Device 1
Device1 : box portmap (IO=>To_Std_Logic(Bused_signal)); -- Instantiate Device 1
Devicen : box portmap (IO=>To_Std_Logic(Bused_signal)): -- Instantiate Device n
```

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A method for determining during simulation of an electronic circuit in a computer whether contention on a simulated bus of the simulated electronic circuit can occur, comprising:

providing a simulated representation of an output of each of a plurality of simulated drivers that are connected to the simulated bus of the simulated electronic circuit, each simulated representation indicating whether the output from the simulated driver is active or inactive;

examining each of the provided simulated representations of the output of a simulated driver to determine whether the output of more than one simulated driver is active; and when it is determined that more than one simulated driver is active, indicating that contention can occur on the simulated bus.

2. The method of claim 1 wherein the simulated electronic circuit is an integrated circuit.

3. The method of claim 1 wherein a first conversion component converts an output type of each of the simulated drivers into a contention detection type suitable for contention detection and a second conversion component converts the contention detection type back to the output type.

4. The method of claim 1 wherein the active state of a simulated driver includes both a predetermined high voltage level and a predetermined low voltage level.

5. The method of claim 1 wherein the active state of a simulated driver corresponds to a logical "1" and a logical "0".

6. The method of claim 1 wherein contention is detected when two or more active simulated drivers each output a predetermined high voltage level.

7. The method of claim 1 wherein contention is detected when two or more active simulated drivers each output a predetermined low voltage level.

8. The method of claim 1 wherein contention is detected when at least one active simulated driver outputs a high voltage level and another active simulated driver outputs a low voltage level.

9. The method of claim 1 wherein contention is detected when two or more active simulated drivers each output the same active value.

10. The method of claim 1 wherein contention is detected in temporal durations smaller than the temporal duration of a clock cycle within the simulated electronic circuit.

11. An apparatus for detecting a contention condition in a simulated bus connected to a plurality of simulated drivers in a simulated electronic circuit, comprising:

a simulated bus having a simulated input from the simulated drivers connected to the simulated bus; and a contention detection component that has been configured to examine the simulated input from each the simulated drivers and configured to indicate contention if more than one simulated input is in an active state.

12. The apparatus of claim 11 wherein the simulated electronic circuit is an integrated circuit.

13. The apparatus of claim 11, further comprising:

a first conversion component that has been configured to convert an output type of the simulated drivers into a contention detection type suitable for use by the contention detection component; and a second conversion component that has been configured to convert the contention detection type into the output type of the simulated drivers.

14. The apparatus of claim 11 wherein the active state of a simulated driver includes both a predetermined high voltage level and a predetermined low voltage level.

15. The apparatus of claim 11 wherein the active state of a simulated driver corresponds to a logical "1" and a logical "0".

16. The apparatus of claim 11 wherein the contention detection component detects contention when two or more active simulated drivers each output a predetermined high voltage level.

17. The apparatus of claim 11 wherein the contention detection component detects contention when two or more active simulated drivers each output a predetermined low voltage level.

18. The apparatus of claim 11 wherein the contention detection component detects contention when at least one active simulated driver outputs a high voltage level and another active simulated driver outputs a low voltage level.

19. The apparatus of claim 11 wherein the contention detection component detects contention in temporal durations smaller than the temporal duration of a clock cycle within the simulated electronic circuit.

20. A method in a resolution function for detecting contention in a simulated electronic circuit, the resolution function configured to determine a resolved value for a simulated bus based upon outputs from simulated devices driving the simulated bus, comprising:

providing a simulated representation of the output of the simulated devices driving the simulated bus, each simulated representation indicating whether the output from the simulated driver is active or inactive;

examining each of the provided simulated representations of the output of a simulated devices to determine whether the output of more than one simulated device is active; and when it is determined that more than one simulated device is active, indicating that contention can occur on the simulated bus.

21. The method of claim 20 wherein the simulated electronic circuit is an integrated circuit.

22. The method of claim 20 wherein a first conversion component converts an output type of each of the simulated devices into a contention detection type suitable for contention detection and a second conversion component converts the contention detection type back to the output type.

23. The method of claim 20 wherein the active state of a simulated device includes both a predetermined high voltage level and a predetermined low voltage level.

24. The method of claim 20 wherein the active state of a simulated device corresponds to a logical "1" and a logical "0".

25. The method of claim 20 wherein contention is detected when two or more active simulated devices each output a predetermined high voltage level.

26. The method of claim 20 wherein contention is detected when two or more active simulated devices each output a predetermined low voltage level.

27. The method of claim 20 wherein contention is detected when at least one active simulated device outputs a high voltage level and another active simulated device outputs a low voltage level.

28. The method of claim 20 wherein contention is detected in temporal durations smaller than the temporal duration of a clock cycle within the simulated electronic circuit.

* * * * *